(12) United States Patent
    Liang et al.

(10) Patent No.: US 10,155,214 B2
(45) Date of Patent: Dec. 18, 2018

(54) GETTER, MEMS DEVICE AND METHOD OF FORMING THE SAME

(71) Applicant: Taiwan Semiconductor Manufacturing Company Limited, Hsinchu (TW)

(72) Inventors: Chin-Wei Liang, Hsinchu County (TW); Cheng-Yuan Tsai, Hsin-Chu County (TW); Chun-Wen Cheng, Hsinchu County (TW); Chia-Shiung Tsai, Hsin-Chu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 493 days.

(21) Appl. No.: 14/252,835

(22) Filed: Apr. 15, 2014

(65) Prior Publication Data
    US 2016/0214077 A1    Jul. 28, 2016

(51) Int. Cl.
| | |
|---|---|
| *C22C 30/00* | (2006.01) |
| *B01J 20/02* | (2006.01) |
| *B81B 7/00* | (2006.01) |
| *B01J 20/32* | (2006.01) |
| *C22C 27/02* | (2006.01) |
| *C22C 16/00* | (2006.01) |
| *C22C 14/00* | (2006.01) |

(52) U.S. Cl.
    CPC ........... *B01J 20/02* (2013.01); *B01J 20/3234* (2013.01); *B81B 7/0038* (2013.01); *C22C 14/00* (2013.01); *C22C 16/00* (2013.01); *C22C 27/02* (2013.01); *C22C 30/00* (2013.01)

(58) Field of Classification Search
    CPC .................................................. C22C 27/02
    See application file for complete search history.

(56) References Cited

U.S. PATENT DOCUMENTS

| | | | | |
|---|---|---|---|---|
| 3,713,906 | A * | 1/1973 | Van Thyne et al. | .... C22C 27/02 |
| | | | | 148/317 |
| 2003/0141802 | A1* | 7/2003 | Liebeskind | ............. H01J 29/94 |
| | | | | 313/495 |
| 2013/0089955 | A1* | 4/2013 | Baillin | ................ B81C 1/00285 |
| | | | | 438/115 |

OTHER PUBLICATIONS

Zhi-Wei, W., Li, J., Huai-Xin, Y., Huan-Fang, T., Hong-Long, S., Zhen, W., & Jian-Qi, L. (2011). Superconductivities and structural properties of ternary Ti—Zr—Ta alloys. Chinese Physics B, 20(11), 117402.*
Yufeng, J. and Jiaxun, Z., Sep. 2005. MEMS vacuum packaging technology and applications. In Electronic Packaging Technology, 2005 6th International Conference on (pp. 1-5). IEEE.*

* cited by examiner

*Primary Examiner* — Jessee R Roe
*Assistant Examiner* — Jophy S. Koshy
(74) *Attorney, Agent, or Firm* — Jones Day

(57) ABSTRACT

A getter is provided. The getter consists essentially of from about 0% to 50% of titanium, from about 0% to 50% zirconium, and from about 5% to 50% of tantalum. A MEMS device is provided. The MEMS device includes a substrate and a getter over the substrate. The getter consists essentially of from about 0% to 50% of titanium, from about 0% to 50% zirconium, and from about 5% to 50% of tantalum. A method of forming a MEMS device is provided. The method includes the following operations: providing a substrate; and providing a getter over the substrate, wherein the getter consists essentially of from about 0% to 50% of titanium, from about 0% to 50% zirconium, and from about 5% to 50% of tantalum, and wherein all of the percentages are atomic percentages.

20 Claims, 3 Drawing Sheets

GETTER, MEMS DEVICE AND METHOD OF FORMING THE SAME

BACKGROUND

CMOS-compatible MEMS packaging is widely used nowadays. However, combinations of CMOS technology and MEMS may cause an out-gassing issue. The subsequent pressure level shift within the MEMS device induced by the out-gassing issue may degrade the performance. Therefore, there is a need to solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
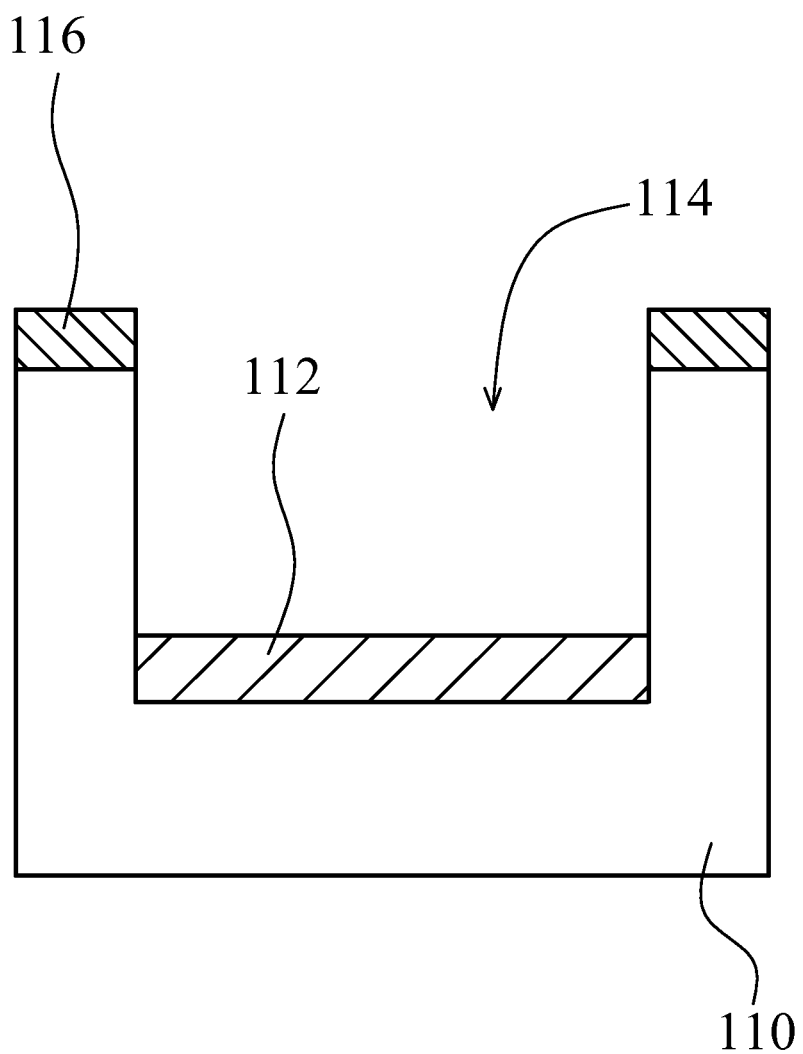
FIG. 1 is a sectional view illustrating an exemplar MEMS device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a getter and a MEMS device including the getter. The disclosure also provides a method of forming the MEMS device. The disclosure utilizes a getter consisting of about 0% to 50% of titanium, from about 0% to 50% zirconium, and from about 5% to 50% of tantalum. For adsorption of oxygen and nitrogen, tantalum (Ta) possesses a better gas diffusivity which increases grain boundary compared to titanium (Ti) and zirconium (Zr), so that TiZrTa has better getter efficiency compared to TiZr. Moreover, during formation of the getter over a substrate (e.g., silicon), the risk of the getter with tantalum contaminating the substrate is lower than the getter with vanadium because of much lower diffusivity of tantalum (about $8*10^{-15}$ cm$^2$/sec at 1000° C.) compared to vanadium (about $2*10^{-8}$ cm$^2$/sec at 1100° C.).

Additionally, at present, the purity of vanadium that material vendors can produce is from 2N to 3N5, which does not meet fab requirements (more than 4N) for physical vapor deposition (PVD) in some CMOS processes. Tantalum material that material vendors can produce usually has higher purity (e.g., 4N) than vanadium and is more suitable for the above process. Therefore, the getter consisting of TiZrTa may provide good getter efficiency, low contamination risk, and compliance with the CMOS process.

FIG. 1 is a sectional view illustrating an exemplar MEMS device in accordance with some embodiments. As shown in FIG. 1, a substrate 110 (e.g., silicon) having a cavity 114 is provided. A getter 112 is formed in the cavity 114 and over the substrate 110. The getter 112 consists essentially of titanium, zirconium and tantalum. Additionally, the getter 112 may consist essentially of from about 0% to 50% of titanium, from about 0% to 50% zirconium, and from about 5% to 50% of tantalum. All of the percentages (%) refer to atomic percentages. Furthermore, eutectic material 116 is formed over the substrate 110 for further wafer bonding.

In some embodiments, titanium of the getter 112 is from about 0% to 40%, 10% to 40%, 15% to 35%, 20% to 30%, 0% to 10%, 10% to 20%, 20% to 30%, 30% to 40%, 40% to 50%. In some embodiments, zirconium of the getter 112 is from about 0% to 40%, 10% to 40%, 15% to 35%, 20% to 30%, 0% to 10%, 10% to 20%, 20% to 30%, 30% to 40%, 40% to 50%. In some embodiments, tantalum of the getter 112 is from about 5% to 40%, 10% to 40%, 15% to 35%, 20% to 30%, 5% to 10%, 10% to 20%, 20% to 30%, 30% to 40%, 40% to 50%.

In some embodiments, titanium of the getter 112 is from about 33.3%, zirconium of the getter 112 is from about 33.3%, and tantalum of the getter 112 is from about 33.3%. In some embodiments, titanium of the getter 112 is from about 50%, zirconium of the getter 112 is from about 20%, and tantalum of the getter 112 is from about 30%. In some embodiments, titanium of the getter 112 is from about 47.5%, zirconium of the getter 112 is from about 47.5%, and tantalum of the getter 112 is from about 5%.

For adsorption of oxygen and nitrogen, tantalum possesses a better gas diffusivity which increases grain boundary compared to titanium and zirconium, so that the getter 112 consisting of TiZrTa has better getter efficiency compared to TiZr. Moreover, during formation of the getter 112 over a substrate 110 (e.g., silicon), the risk of the getter 112 with tantalum contaminating the substrate is lower than the getter with vanadium because of much lower diffusivity of tantalum (about $8*10^{-15}$ cm$^2$/sec at 1000° C.) compared to vanadium (about $2*10^{-8}$ cm$^2$/sec at 1100° C.).

Additionally, at present, the purity of vanadium that material vendors can produce is from 2N to 3N5, which does not meet fab requirements (more than 4N) for physical vapor deposition (PVD) in some CMOS processes. Tantalum material that material vendors can produce usually has higher purity (e.g., 4N) than vanadium and is more suitable for the above processes. Therefore, the getter 112 consisting of TiZrTa may provide good getter efficiency, low contamination risk and compliance with the CMOS process.

Figure 2:
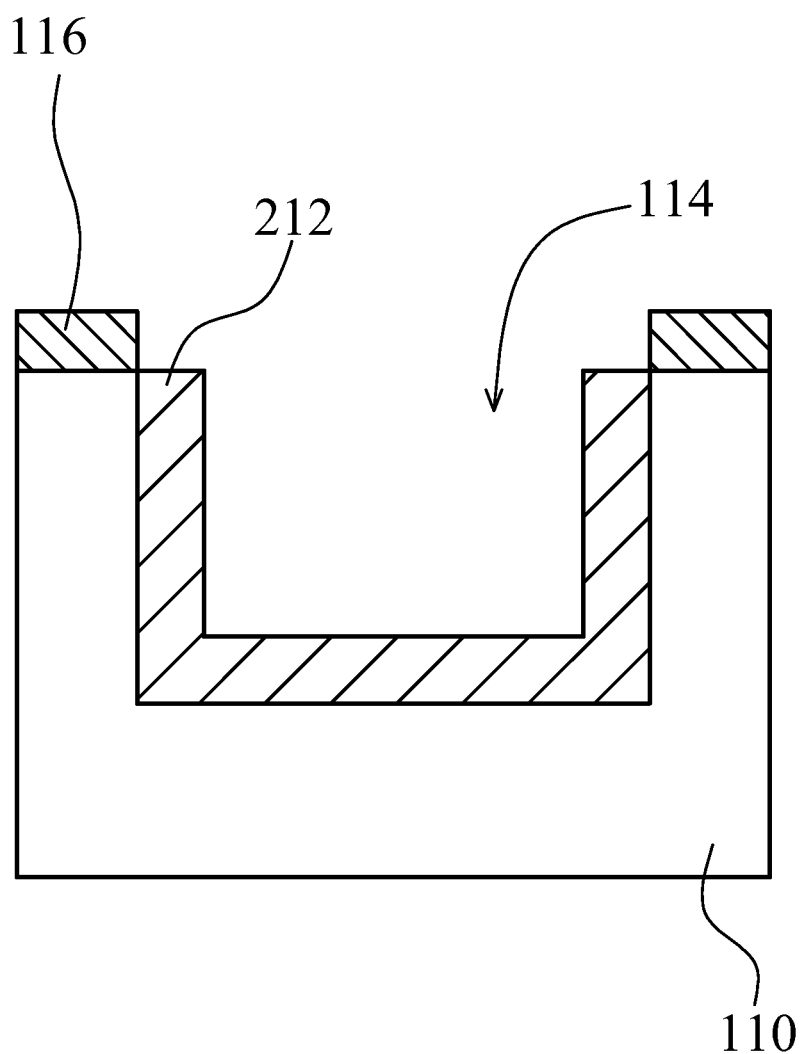
FIG. 2 is a sectional view illustrating an exemplar MEMS device in accordance with some embodiments.

FIG. 2 is a sectional view illustrating an exemplar MEMS device in accordance with some embodiments. As shown in FIG. 2, compared to FIG. 1, in addition to being formed over the bottom surface of the cavity 114, the getter 212 is further formed over the sidewall of the cavity 114 so as to provide larger surface area for adsorption. The other components in FIG. 2 are similar to those in FIG. 1 and are not repeated.

Figure 3:
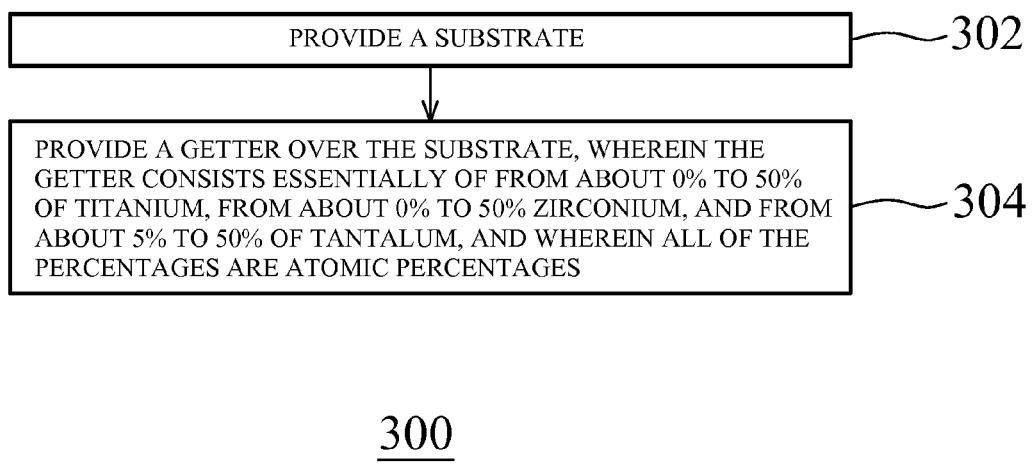
FIG. 3 is a flow chart for a method forming a MEMS device in accordance with some embodiments.

FIG. 3 is a flow chart for a method forming a MEMS device in accordance with some embodiments. As shown in FIG. 3, a method 300 is provided. The method 300 includes the following operations: providing a substrate (302); and providing a getter over the substrate, wherein the getter consists essentially of from about 0% to 50% of titanium, from about 0% to 50% zirconium, and from about 5% to 50% of tantalum, and wherein all of the percentages are atomic percentages (304).

According to an exemplary embodiment, a getter is provided. The getter consists essentially of from about 0% to 50% of titanium, from about 0% to 50% zirconium, and from about 5% to 50% of tantalum. All of the percentages refer to atomic percentages.

According to an exemplary embodiment, a MEMS device is provided. The MEMS device includes a substrate and a getter over the substrate. The getter consists essentially of from about 0% to 50% of titanium, from about 0% to 50% zirconium, and from about 5% to 50% of tantalum. All of the percentages refer to atomic percentages.

According to an exemplary embodiment, a method of forming a MEMS device is provided. The method includes the following operations: providing a substrate; and providing a getter over the substrate, wherein the getter consists essentially of from about 0% to 50% of titanium, from about 0% to 50% zirconium, and from about 5% to 50% of tantalum, and wherein all of the percentages are atomic percentages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MEMS device, comprising:
a substrate including a top surface, a cavity extending downward from the top surface, and a vertical side surface and a horizontal bottom surface bounding the cavity; and
a getter overlying the vertical side surface and the horizontal bottom surface, the getter consisting essentially of
from a non-zero amount up to about 50% of titanium,
from a non-zero amount up to about 50% zirconium, and
from about 5% to 50% of tantalum,
all of the percentages being atomic percentages; and
a eutectic material overlying the substrate's top surface from a top end of the side surface.

2. A MEMS device, comprising:
a substrate including a cavity extending downward from a top surface, a horizontal bottom surface bounding the cavity and a vertical side surface bounding the cavity;
a getter overlying the horizontal bottom surface of the cavity, wherein the getter includes
from about 10% to 50% of titanium,
from about 10% to 50% zirconium, and
from about 5% to 50% of tantalum,
all of the percentages being atomic percentages; and
a eutectic material overlying the substrate's top surface from a top end of the side surface.

3. A method of forming a MEMS device, comprising:
providing a substrate that includes a top surface, a cavity extending downward from the top surface, and a vertical side surface bounding the cavity; and
providing a getter overlying the vertical side surface of the cavity, wherein the getter consists essentially of
from a non-zero amount up to about 50% of titanium,
from a non-zero amount up to about 50% zirconium, and
from about 5% to 50% of tantalum, and
wherein all of the percentages are atomic percentages, and
providing a eutectic material overlying the substrate's top surface from a top end of the side surface.

4. The device of claim 1, wherein titanium is from about 33.3%, zirconium is from about 33.3%, and tantalum is from about 33.3%, in terms of atomic percentages of the getter.

5. The device of claim 1, wherein titanium is from about 50%, zirconium is from about 20%, and tantalum is from about 30%, in terms of atomic percentages of the getter.

6. The device of claim 1, wherein titanium is from about 10% to 40%, and the zirconium is from about 10% to 40%, in terms of atomic percentages of the getter.

7. The device of claim 1, wherein the getter overlies the side surface from the top end of the side surface to a bottom end of the side surface as well as the horizontal bottom surface.

8. The device of claim 6, wherein titanium is from about 10% to 20% in terms of atomic percentages of the getter.

9. The device of claim 6, wherein titanium is from about 20% to 30% in terms of atomic percentages of the getter.

10. The device of claim 6, wherein titanium is from about 30% to 40% in terms of atomic percentages of the getter.

11. The device of claim 6, wherein zirconium is from about 10% to 20% in terms of atomic percentages of the getter.

12. The device of claim 6, wherein zirconium is from about 20% to 30% in terms of atomic percentages of the getter.

13. The device of claim 6, wherein zirconium is from about 30% to 40% in terms of atomic percentages of the getter.

14. The device of claim 6, wherein zirconium is from about 15% to 35% in terms of atomic percentages of the getter.

15. The device of claim 6, wherein tantalum is from about 5% to 40% in terms of atomic percentages of the getter.

16. The device of claim 6, wherein titanium is from about 47.5%, zirconium is from about 47.5%, and tantalum is from about 5%, in terms of atomic percentages of the getter.

17. The method of claim 6, further comprising:
using the eutectic material for wafer bonding.

18. The device of claim 2, wherein the getter overlies the side surface from a top end of the side surface to a bottom end of the side surface as well as the horizontal bottom surface.

19. The device of claim 18, wherein:
the getter is lining both the vertical side surface and the horizontal bottom surface; and the getter consists essentially of 33.3% titanium, 33.3% zirconium, and 33.3% tantalum, in terms of atomic percentages of the getter.

20. The method of claim 3, wherein titanium is from about 10% to 40%, and the zirconium is from about 10% to 40%, in terms of atomic percentages of the getter.

* * * * *